(12) United States Patent
Matsuura et al.

(10) Patent No.: US 11,071,214 B2
(45) Date of Patent: Jul. 20, 2021

(54) METHOD FOR MANUFACTURING MULTILAYER WIRING BOARD

(71) Applicant: MITSUI MINING & SMELTING CO., LTD., Tokyo (JP)

(72) Inventors: Yoshinori Matsuura, Ageo (JP); Yasuhiro Seto, Ageo (JP); Toshimi Nakamura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 109 days.

(21) Appl. No.: 16/471,706

(22) PCT Filed: Dec. 22, 2016

(86) PCT No.: PCT/JP2016/088566
§ 371 (c)(1),
(2) Date: Jun. 20, 2019

(87) PCT Pub. No.: WO2018/116477
PCT Pub. Date: Jun. 28, 2018

(65) Prior Publication Data
US 2019/0335594 A1 Oct. 31, 2019

(51) Int. Cl.
*G01R 31/28* (2006.01)
*H05K 3/02* (2006.01)
(Continued)

(52) U.S. Cl.
CPC ............ *H05K 3/4682* (2013.01); *H05K 3/06* (2013.01); *H05K 3/4652* (2013.01);
(Continued)

(58) Field of Classification Search
CPC ..... H05K 2203/0152; H05K 2203/162; H05K 1/0268; H05K 3/4682; H05K 3/06;
(Continued)

(56) References Cited

U.S. PATENT DOCUMENTS 4,306,925 A * 12/1981 Lebow .................. H05K 3/205
29/848
5,006,808 A *  4/1991 Watts ................. G01R 31/2805
324/537
(Continued)

FOREIGN PATENT DOCUMENTS

JP      2003-347459 A    12/2003
JP      2004-111536 A     4/2004
(Continued)

OTHER PUBLICATIONS

International Search Report in International Patent Application No. PCT/JP2016/088566, dated Mar. 14, 2017.
(Continued)

*Primary Examiner* — Donghai D Nguyen
(74) *Attorney, Agent, or Firm* — Greenblum & Bernstein, P.L.C.

(57) ABSTRACT

Provided is a method of manufacturing a multilayer wiring board, in which electrical inspection can be performed with accurate probing while warpage of a multilayer laminate is reduced. This method includes providing a laminated sheet including a first support, a first release layer and a metal layer; alternately stacking wiring layers and insulating layers on a surface of the metal layer, wherein an n-th wiring layer being the uppermost layer includes an n-th connection pad; bonding a second support having an opening on a surface, remote from the laminated sheet, of the multilayer laminate with a second release layer therebetween such that at least a part of the n-th connection pad is disposed within the opening; releasing the first support from the reinforced multilayer laminate at the first release layer; and putting conductors into contact with the n-th connection pads of the reinforced multilayer laminate to perform electrical inspection.

9 Claims, 3 Drawing Sheets (51) Int. Cl.
*H05K 3/46* (2006.01)
*H05K 3/06* (2006.01)

(52) U.S. Cl.
CPC ... *H05K 3/4697* (2013.01); *H05K 2203/0152* (2013.01); *H05K 2203/162* (2013.01)

(58) Field of Classification Search
CPC .... H05K 3/4652; H05K 3/4697; H05K 3/007; H01L 23/12; Y10T 29/49126; Y10T 29/49155
USPC .......................................... 29/830, 846, 593
See application file for complete search history.

(56) References Cited

U.S. PATENT DOCUMENTS

| | | | | |
|---|---|---|---|---|
| 7,138,064 | B2 * | 11/2006 | Honda | ................ H01L 21/4857 216/13 |
| 2004/0053489 | A1 | 3/2004 | Kata et al. | |
| 2005/0088833 | A1 | 4/2005 | Kikuchi et al. | |
| 2006/0189125 | A1 | 8/2006 | Kata et al. | |
| 2007/0082501 | A1 | 4/2007 | Hurwitz et al. | |
| 2015/0044359 | A1 | 2/2015 | Chien et al. | |

FOREIGN PATENT DOCUMENTS

| | | |
|---|---|---|
| JP | 2008-039725 A | 2/2008 |
| JP | 2009-512212 A | 3/2009 |
| JP | 2014-214208 A | 11/2014 |
| JP | 2015-170767 A | 9/2015 |
| JP | 2016-114484 A | 6/2016 |
| JP | 2016-178101 A | 10/2016 |

OTHER PUBLICATIONS

Written Opinion of the International Searching Authority for PCT/JP2016/088566, dated Mar. 14, 2017.

* cited by examiner

METHOD FOR MANUFACTURING MULTILAYER WIRING BOARD

TECHNICAL FIELD

The present invention relates to a method of manufacturing a multilayer wiring board.

BACKGROUND ART

In recent years, multilayering of printed wiring boards has been widely prevailed to increase the mounting density of printed wiring boards and miniaturize the boards. Such multilayer wiring boards have been extensively used in portable electronic devices for the purpose of weight reduction and miniaturization. These multilayer wiring boards require a further reduction in thickness of interlayer insulating layers and a further reduction in weight of wiring boards.

Meanwhile, thin multilayer wiring boards have decreased strength that may result in reductions in handling properties. For this reason, various methods have been proposed for an electrical inspection of thin multilayer wiring boards. For example, PTL 1 (JP2008-39725A) discloses a method of an electrical inspection of a thin printed wiring board disposed between flat plate jigs having openings where inspection probes are put into contact with the two surfaces of the inspected region of the board through the openings. In addition, PTL 2 (JP2016-178101A) discloses a method in which an adhesive layer and a high-resistance conductive layer are sequentially stacked on a support, and an electrical inspection is carried out from the surface of a build-up wiring layer that is formed on the high-resistance conductive layer. PTL 3 (JP2016-114484A) discloses a method in which an end portion of a wiring board is disposed between a presser plate and a mesh plate, the wiring board is located on a stage and attached through the vacuum suction, and then an electrical inspection is carried out in a state where the suction is maintained and probes are in contact with both surfaces of the wiring board.

CITATION LIST

Patent Literatures

PTL 1: JP2008-39725A
PTL 2: JP2016-178101A
PTL 3: JP2016-114484A
PTL 4: JP2014-214208A
PTL 5: JP2015-170767A

SUMMARY OF INVENTION

However, the prior techniques as described above have various problems. For example, in PTL 1, a thin wiring board, which exhibits low rigidity, will readily undergo warpage that leads to difficulty in accurate positioning of the wiring board to the opening of the flat plate jigs when the wiring board is sandwiched between the flat plate jigs. The electrical inspection performed by the method described in PTL 2 is available for only a continuity test (detection of connection failure), and cannot be applied to an insulation test (detection of a short circuit between wires) without the release of the support and the removal of the high-resistance conductive layer. In addition, since a multilayer laminate is a thin wiring board after releasing, the warpage readily occurs and the electrical inspection is still difficult to perform. In PTL 3, a thin multilayer laminate easily warps when fixed by the presser plate, leading to difficulty in accurate positioning for bringing the probes into contact with the wiring board.

The present inventors have now found through the manufacture of a multilayer wiring board that the opening of a second support can be positioned with high accuracy to the n-th connection pad on the surface of a multilayer laminate originally including a first support through bonding the second support having the opening to the multilayer laminate, and reduced warpage ensures the desirable flatness of the two sides of the multilayer laminate and thus achieves accurate probing for the electrical inspection.

Accordingly, an object of the present invention is to provide a method of manufacturing a multilayer wiring board capable of an accurate probing in an electrical inspection and reducing the warpage of a multilayer laminate.

According to one embodiment of the present invention, a method of manufacturing a multilayer wiring board is provided, the method comprising the steps of:

providing a laminated sheet having, in sequence, a first support, a first release layer and a metal layer;

alternately stacking wiring layers and insulating layers on a surface of the metal layer to give a multilayer laminate, wherein an n-th wiring layer being the uppermost layer includes an n-th connection pad;

bonding a second support having an opening on a surface, remote from the laminated sheet, of the multilayer laminate with a second release layer therebetween such that at least a part of the n-th connection pad is disposed within the opening to give a reinforced multilayer laminate, wherein the second release layer is applied to the entire area or the partial area of the surface to be bonded of the second support;

releasing the first support from the reinforced multilayer laminate at the position of the first release layer; and putting conductors into contact with the n-th connection pads of the reinforced multilayer laminate to perform electrical inspection.

DESCRIPTION OF EMBODIMENTS

Method of Manufacturing Multilayer Wiring Board

A method of manufacturing a multilayer wiring board according to the present invention comprises the steps of: (1) providing a laminated sheet having a first support, (2) producing a multilayer laminate, (3) bonding a second support having an opening, (4) optionally bonding a third support, (5) releasing the first support, (6) optionally attaching a plate having an opening, (7) optionally releasing the third support, (8) optionally detaching the plate, (9) electrically inspecting, and (10) optionally releasing the second support. Each of Steps (1) to (10) is not necessarily performed in this sequence, and may be performed in any sequence within a range that holds technical consistency. For example, step (9) (electrically inspecting) may be performed before step (5) (releasing the first support) and after step (3) (bonding a second support).

Each of Steps (1) to (10) will be described below with reference to the accompanying drawings.

(1) Provision of Laminated Sheet Including First Support

Figure 1:
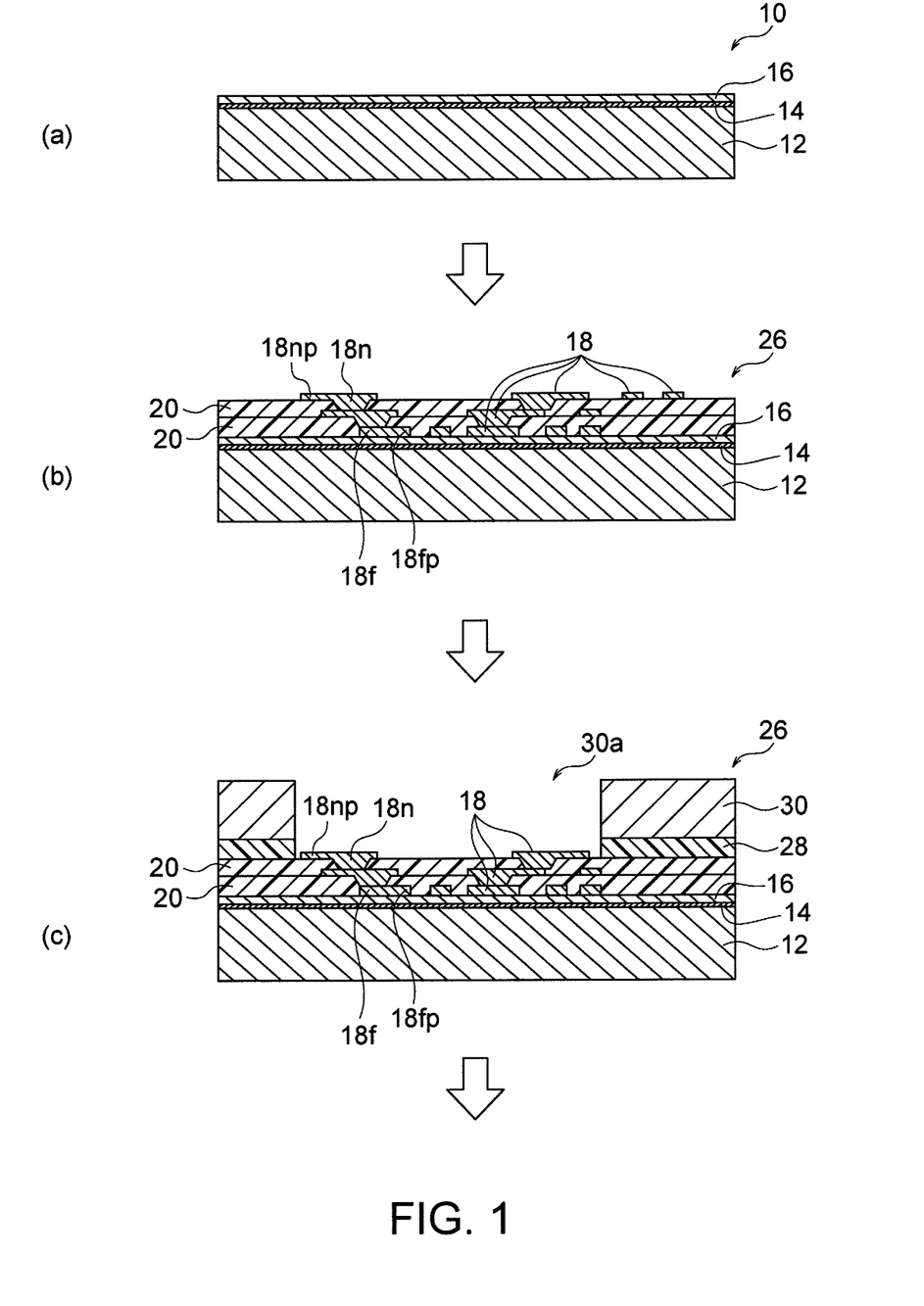
FIG. 1 is a process flow chart illustrating steps from the provision of a laminated sheet to the bonding of a second support in the method of manufacturing of the present invention.

As shown in FIG. 1(a), a laminated sheet 10 is provided as a base for forming a multilayer wiring board. The laminated sheet 10 includes, in sequence, a first support 12, a first release layer 14, and a metal layer 16. The laminated sheet 10 may be in the form of a so-called copper foil with a carrier. The metal layer 16 is a layer made of metal, and preferably includes a power supply layer that can supply power to a first wiring layer 18f described later. The metal layer 16 may have a multilayer structure. For example, the metal layer 16 may be provided with an antireflection layer on the surface, adjacent to the first release layer 14, of the power supply layer, in addition to the power supply layer. Preferred embodiments of the laminated sheet 10 in the present invention will be described later.

(2) Production of Multilayer Laminate

As shown in FIG. 1(b), wiring layers 18 and insulating layers 20 are alternately stacked on the surface of the metal layer 16 to produce a multilayer laminate 26. In this process, an n-th wiring layer 18n, which is the uppermost wiring layer 18, includes an n-th connection pad 18np. The sequential stacked structure composed of the wiring layers 18 and the insulating layer 20 shown in FIG. 1(b) is generally referred to as a build-up layer or a build-up wiring layer. Examples of the method of the present invention include, but is not limited to, forming a multilayer laminate consisting of only a known build-up wiring layer structure commonly employed in a printed wiring board and alternately stacking a laminate which builds up a part of a multilayer laminate with preliminarily formed bumps, with an insulating adhesive layer therebetween.

Figure 2:
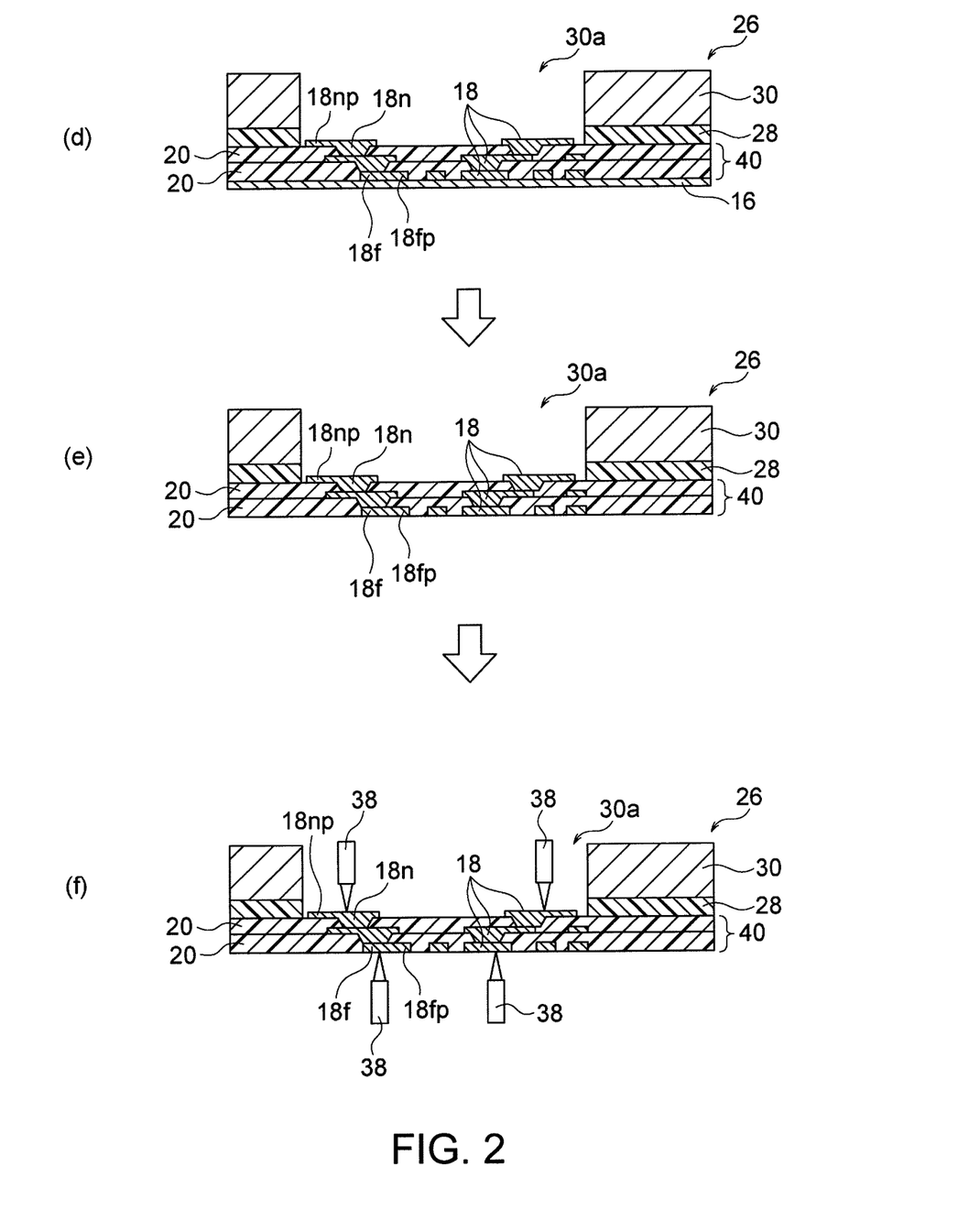
FIG. 2 is a process flow chart illustrating steps from the release of a first support to the electrical inspection in the method of manufacturing of the present invention.

The multilayer laminate 26 given through a series of processes including steps described later finally has a first wiring layer 18f. The first wiring layer 18f may include a first connection pad 18fp. It is preferred that (i) the first wiring layer 18f be formed on the metal layer 16 in the initial step for alternately stacking the wiring layers 18 and the insulating layer 20, from the viewpoint of making a fine wiring of the first wiring layer 18f and ensuring the flatness on the surface, adjacent to the first support 12, of the first wiring layer 18f. Alternatively, (ii) the first wiring layer 18f may be formed after releasing the first support 12. The embodiment shown in FIGS. 1 and 2 is based on the above (i). In a preferred embodiment of the above (ii), the metal layer 16 may be etched after the release of the first support 12 and before the electrical inspection to form a first wiring layer 18f including the first connection pad 18fp. This embodiment is preferably applicable to the case where the thickness of the metal layer 16 is the same as the thickness of the wiring layers 18 (for example, 3 to 50 µm). Alternatively, in another preferred embodiment of the above (ii), the first wiring layer 18f including the first connection pads 18fp may be formed on the surface, remote from the insulating layer 20, of the metal layer 16 after the release of the first support 12 and before the electrical inspection. In this embodiment, the first wiring layer can be formed by electroplating using the metal layer 16 itself as a power supply layer. In this case, even if the metal layer 16 in the region other than the first wiring layer 18f is removed by etching, the metal layer 16 remains between the first wiring layer 18f and the insulating layer 20.

In the preferred embodiment based on the above (i), the wiring layer 18 initially formed on the surface, remote from the first release layer 14, of the metal layer 16 is the first wiring layer 18f including the first connection pad 18fp. In this embodiment, the first wiring layer 18f is formed in advance on the metal layer 16 before the insulating layer 20 is stacked. In this case, the first wiring layer 18f is initially formed on the surface of the metal layer 16. Typically, the first wiring layer 18f is formed through formation of a photoresist layer, formation of an electroplated copper layer, stripping of the photoresist layer, and optional copper flash etching in accordance with a known procedure. For example, the photoresist layer is initially formed into a predetermined pattern on the surface of the metal layer 16. The photoresist is preferably a photosensitive film, such as a photosensitive dry film. The photoresist layer may be provided with a predetermined wiring pattern through the exposure and development. The electroplated copper layer is formed on the exposed surface of the metal layer 16 (that is, a portion not masked with the photoresist layer). Copper may be electroplated by any known process. The photoresist layer is then stripped. As a result, the electroplated copper layer remains in the form of the wiring pattern to be the first wiring layer 18f, and the metal layer 16 is exposed at one or more portions where the wiring pattern is not formed.

Figure 3:
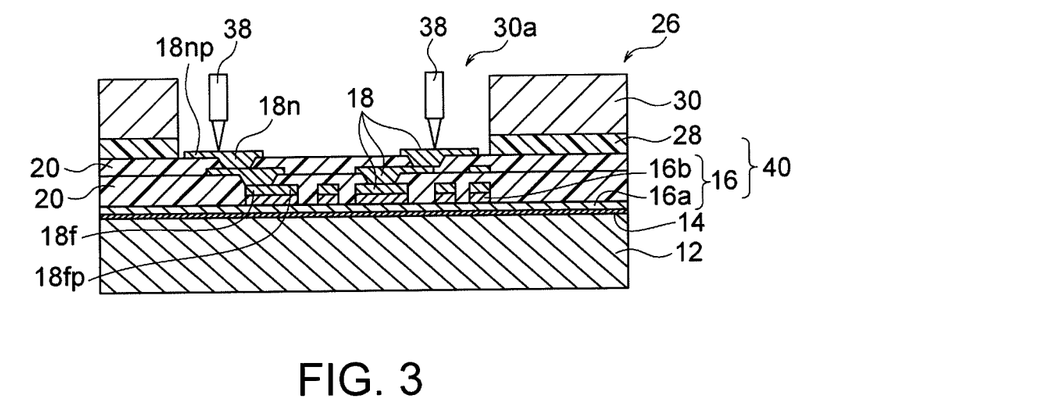
FIG. 3 is a schematic cross-sectional view illustrating exemplary electrical inspection when a metal layer includes an antireflection layer and a power supply layer where the antireflection layer is remained as a common electrode.

In the embodiment based on the above (i), the metal layer 16 may include an antireflection layer (for example, a titanium layer) and a power supply layer (for example, a copper layer) in sequence from the first release layer 14. In addition, the portion corresponding to the power supply layer of the metal layer 16 may be removed by flash etching to expose the antireflection layer. In this case, as shown in FIG. 3, the metal layer 16 (in particular, the power supply layer 16b) can function as a power supply layer for the plating process to form the first wiring layer 18f. As also shown in FIG. 3, only the antireflection layer 16a remains after the first wiring layer 18f is formed, and the antireflection layer 16a is used as a common electrode, thereby a preliminary continuity test can be performed by contact of conductors 38 to two of first connection pads 18fp. The antireflection layer is preferably composed of at least one metal selected from Cr, W, Ta, Ti, Ni and Mo, and more preferably Ti. These metals have a predetermined sheet resistance (for example, 0.1 to 1000 Ω/sq.), which facilitates the continuity test through, for example, via holes. In addition, these metals can exhibit high chemical resistance to a copper flash etching solution since the metals cannot dissolve in the copper flash etching solution.

In any case, the wiring layers 18 and the insulating layers 20 are alternately stacked to give the multilayer laminate 26. The number of insulating layers 20 may be one or more. The multilayer wiring board 40 of the present invention has at least two wiring layers 18 accompanied with at least one insulating layer 20.

A solder resist layer and/or a surface metal treatment layer (for example, an organic solderability preservative (OSP) treatment layer, an Au plating layer, a Ni—Au plating layer, a Ni—Pd—Au plating layer) may be formed as needed on the n-th wiring layer 18n at the uppermost surface of the build-up wiring layer.

(3) Bonding of Second Support Having Opening

As shown in FIG. 1(c), a second support 30 having an opening 30a is bonded to the surface, remote from the laminated sheet 10, of the multilayer laminate 26 with the second release layer 28 therebetween such that at least a part of the n-th connection pad 18np is disposed within the opening 30a, thereby giving a reinforced multilayer laminate 26. In this step, the multilayer laminate 26 can be reinforced not to cause great local warpage by the second support 30. Accordingly, the warpage during releasing is effectively prevented or restrained. The disconnection and separation of the wiring layer which may be caused by the warpage can be avoided inside the build-up wiring layer, thereby connection reliability of the multilayer wiring layer can be improved. In addition, the flatness (coplanarity) on the surface of the multilayer wiring layer can be improved through the effective prevention or restraint of warpage. As a result, the probing can be accurately performed at the time of the electrical inspection.

In particular, according to the method of the present invention, the multilayer laminate 26 is pre-reinforced to some extent because the multilayer laminate 26 includes the first support 12 in advance, in other words, is entirely supported by the first support 12. The second support 30 can accordingly be bonded to the proper position of the multilayer laminate 26 stably fixed accompanied with the first support 12 even if the multilayer laminate 26 is significantly thin. That is, the opening 30a of the second support 30 can exactly be positioned to the n-th connection pad 18np on the surface of the multilayer laminate 26. For example, the second support 30 can be mounted with high accuracy using, for example, a semiconductor mounting machine and various positioning devices employed in a printed wiring board process.

The opening 30a of the second support 30 has a shape and size such that at least a part of the n-th connection pad 18np is positioned within the opening 30a when the second support 30 is bonded to the multilayer laminate 26. Accordingly, only the part of the n-th connection pad 18np may be positioned within the opening 30a, for example, only the peripheral portion or the end portion of the n-th connection pad 18np may be located in the opening 30a. In particular, the configuration is preferred, in which all of the n-th connection pads 18np are accommodated within the openings 30a.

The second support 30 has an aperture rate of, preferably 3 to 90%, more preferably 20 to 70%, further more preferably 30 to 60%. The aperture rate is calculated as the proportion of the total volume of the openings 30a to the overall volume of the second support 30, that is, ((total volume of the openings 30a)/(overall volume of the second support 30))×100. In this expression, the overall volume of the second support 30 indicates the imaginary volume of the second support 30 calculated without the openings (that is, the openings 30a are completely closed). Within the above ranges, the second support 30 can have sufficiently high strength while the conductor 38 has a sufficiently large region enabling contact with the n-th connection pad 18np, thereby the multilayer laminate 26 can be reinforced more effectively.

The second support 30 preferably has a Vickers hardness lower than that of the first support 12. Based on this property, the second support 30 itself warps when the second support 30 is stacked or released, so that the stress that may be generated during stacking or releasing can be appropriately relieved. As a result, the warpage of the multilayer laminate 26 including the first support 12 can be effectively prevented or restrained. The second support 30 has a Vickers hardness of preferably 2 to 99%, more preferably 6 to 90%, further more preferably 10 to 85% of that of the first support 12. Preferably, the second support 30 has a Vickers hardness of 50 to 700 HV and the first support 12 has a Vickers hardness of 500 to 3000 HV, more preferably the second support 30 has a Vickers hardness of 150 to 550 HV and the first support 12 has a Vickers hardness of 550 to 2500 HV, and further more preferably the second support 30 has a Vickers hardness of 200 to 500 HV and the first support 12 has a Vickers hardness of 600 to 2000 HV. In the present specification, the Vickers hardness is measured in accordance with the "Vickers hardness test" described in JIS Z 2244-2009.

For reference, the Vickers hardness HV of various candidate materials is exemplified as follows: sapphire glass (2300 HV), hard metal alloy (1700 HV), cermet (1650 HV), quartz (rock crystal) (1103 HV), SKH56 (high speed tool steel, HSS) (722 HV), tempered glass (640 HV), SUS 440C (stainless steel) (615 HV), SUS 630 (stainless steel) (375 HV), titanium alloy 60-types (64 titanium alloy) (about 280 HV), Inconel (heat resistant nickel alloy) (150 to 280HV), S 45C (carbon steel for machine structural use) (201 to 269 HV), Hastelloy alloy (corrosion resistant nickel alloy) (100 to 230 HV), SUS 304 (stainless steel) (187 HV), SUS 430 (stainless steel) (183 HV), cast iron (160 to 180HV), titanium alloy (110 to 150HV), brass (80 to 150HV), and bronze (50 to 100HV).

The second support 30 has a spring deflection limit $Kb_{0.1}$ of preferably 100 to 1500 N/mm$^2$, more preferably 150 to 1200 N/mm$^2$, further more preferably 200 to 1000 N/mm$^2$ as measured in accordance with the repeated deflection test of JIS H 3130-2012. Within such ranges, the second support 30 itself is warped when the second support 30 is stacked or released, such that the stress that may be generated during stacking or releasing can be appropriately relieved and thereby the warpage of the multilayer laminate 26 can be effectively prevented or reduced. Since the second support 30 warped when stacked or released can instantaneously return back to the original flat shape due to its resiliency, the flatness of the multilayer laminate 26 can be more effectively maintained. In addition, the use of the flexibility and resiliency of the second support 30 can urge the second support 30 to which the releasing force is applied in the direction of the release (that is, in the direction away from the multilayer laminate 26), resulting in further smooth release.

For reference, spring limit values $Kb_{0.1}$ for various candidate materials are illustrated in Tables 1 and 2.

TABLE 1

| Material (JIS Number) | Tempering | $Kb_{0.1}$ |
| --- | --- | --- |
| SUS301CSP | 1/2H | 315 |
| (stainless steel) | 3/4H | 390 |
|  | H | 490 |
|  | EH | 590 |
|  | SHE(1) | 650 |
| SUS304CSP | 1/2H | 275 |
| (stainless steel) | 3/4H | 335 |
|  | H | 390 |
| SUS631CSP | O | 635 |
| (stainless steel) | 1/2H | 635 |
|  | 3/4H | 835 |
|  | H | 980 |
| SUS632J1CSP | 1/2H | 1200 |
| (stainless steel) | 3/4H | 1400 |
| C1700 | O | 685 |
| (beryllium-copper alloy) | 1/4H | 785 |
|  | 1/2H | 835 |

TABLE 1-continued

| Material (JIS Number) | Tempering | $Kb_{0.1}$ |
|---|---|---|
| | H | 855 |
| C1720 | O | 735 |
| (beryllium-copper alloy) | 1/4H | 835 |
| | 1/2H | 885 |
| | H | 930 |
| C1720M | OM | 390 |
| (beryllium-copper alloy) | 1/4HM | 440 |
| *mill-hardened material | 1/2HM | 540 |
| | HM | 635 |

TABLE 2

| Material (JIS Number) | Tempering | $Kb_{0.1}$ |
|---|---|---|
| C5210 | 1/2H | 245 |
| (phosphor bronze) | H | 390 |
| | EH | 460 |
| | SH | 510 |
| | ESH | 560 |
| C5240 | H | 430 |
| (phosphor bronze) | EH | 510 |
| | SH | 570 |
| | ESH | 630 |
| | XSH | 700 |
| C7270 | O | 490 |
| (nickel-tin-copper alloy) | 1/4H | 590 |
| | 1/2H | 635 |
| | H | 685 |
| | EH | 735 |
| | SH | 785 |
| C7270M | OM | 440 |
| (nickel-tin-copper alloy) | 1/4HM | 490 |
| *mill-hardened material | 1/2HM | 540 |
| | HM | 590 |
| | EHM | 685 |
| | XHM | 785 |
| C7701 | 1/2H | 390 |
| (nickel-zinc-copper alloy) | H | 480 |
| | EH | 560 |
| | SH | 620 |
| C1990M | 1/4HM | 440 |
| (titanium-copper alloy) | EHM | 590 |
| *mill-hardened material | | |

The second support 30 may be composed of any material, preferably resin, metal, glass or a combination thereof. Examples of the resin include epoxy resins, polyimide resins, polyethylene resins, phenol resins, and prepregs composed of such resins and fiber reinforcing materials. Examples of the metal include stainless steel, and copper alloy (for example, bronze, phosphor copper, copper-nickel alloy, copper-titanium alloy) from the viewpoint of the Vickers hardness and the spring deflection limit $Kb_{0.1}$, preferably stainless steel from the viewpoint of the chemical resistance. The second support 30 may have any form that the warpage of the multilayer laminate 26 can be prevented or reduced, such as a sheet, a film, a plate, and a foil, preferably a sheet or a plate. The second support 30 may be formed by stacking, for example, these sheets, films, plates, and foils. Typical examples of the second support 30 include a metal sheet, a resin sheet (in particular, a hard resin sheet), and a glass sheet. The second support 30 has a thickness of preferably 10 μm to 1 mm, more preferably 50 to 800 μm, further more preferably 100 to 600 μm from the viewpoint of the strength retention and handling readiness of the second support 30. In case that the second support 30 is a metal sheet (for example, stainless steel sheet), a ten-point mean roughness Rz-jis (measured in accordance with JIS B 0601-2001) on the surface of the metal sheet where the second release layer 28 is formed is preferably 0.05 to 500 μm, more preferably 0.5 to 400 μm, further more preferably 1 to 300 μm. Such a surface roughness can enhance the adhesion with the second release layer 28 and improve the release strength in the second release layer 28 due to an anchor effect caused by the irregularities on the surface.

The second release layer 28 may be applied to the entire area on the surface to be bonded of the second support 30, or may be applied only to the partial area on the surface to be bonded of the second support 30. That is, the second release layer 28 may be in any form that can bond the second support 30 to the multilayer laminate 26. Accordingly, the second release layer 28 has any configuration that can bond the second support 30 to the multilayer laminate 26 with desired adhesion strength. The second release layer 28 has a thickness of preferably 0.1 to 50 μm, more preferably 0.5 to 5 μm. Within such thickness ranges, high adhesion can be achieved between the multilayer laminate 26 and the second support 30.

The second release layer 28 is, for example, a known layer which is referred to as an adhesive layer, an adhesive release layer, or a release layer. The second release layer 28 has particularly adhesion, and can be typically an adhesive layer or an adhesive release layer. However, the second release layer 28 may be a release layer having no adhesion.

A preferred embodiment of the second release layer 28 includes a resin layer containing a foaming agent. This resin layer containing the foaming agent foams by heat treatment or ultraviolet treatment before the release to enable mechanical release, whose release strength can be controlled depending on the content of the foaming agent and the thickness of the resin layer. An example resin layer containing a foaming agent that foams by heat treatment includes an adhesive layer containing a thermal foaming agent as disclosed in PTL 4 (JP2014-214208A). In addition, an example of a resin layer containing a foaming agent that foams by ultraviolet light includes a release layer containing a composition that generates gas caused by the irradiation of ultraviolet light as disclosed in PTL 5 (JP2015-170767A).

Another preferred embodiment of the second release layer 28 includes an acid-soluble resin layer or an alkali-soluble resin layer. The acid-soluble or alkali-soluble resin layer can be released by dissolving the layer with a chemical (for example, an acid solution or an alkaline solution), and the release strength thereof can be controlled depending on the content of chemical-soluble components and the thickness of the resin layer. Exemplary acid-soluble resins include resin compositions filled with an acid-soluble filler, such as silica, calcium carbonate, and barium sulfate, at a high concentration of 60 wt % or more. Examples of the resins constituting the resin compositions include epoxy resins, acrylic resins, methacrylic resins, melamine resins, polyester resins, styrene butadiene copolymers, acrylonitrile resins, and polyimide resins. Exemplary alkali-soluble resins include methacrylic acid polymers and acrylic acid polymers. Example of the methacrylic acid polymers includes alkyl methacrylate having alkyl groups having 1 to 18 carbon atoms. Example of the acrylic acid polymers includes alkyl acrylate having alkyl groups having 1 to 18 carbon atoms. In this case, the resin composition may contain, for example, styrene monomers and styrene oligomers in order to improve the strength of the resin. The resin composition may also contain epoxy resins that can be thermally hardened with these resins. Furthermore, the resin compositions may contain, for example, an amine curing agent, a phenol curing agent, and an isocyanate group-containing curing agent in order to improve the thermosetting property with the epoxy resins.

The release strength of the second release layer 28 is preferably higher than that of the first release layer 14. In other words, the second release layer 28 preferably provides higher release strength than the first release layer 14. A method of comparing the release strength in the second release layer 28 with that in the first release layer 14 may be based on the comparison between absolute values of the respective release strengths as described later, or advantageously based on the comparison between the measured values in accordance with the respective releasing patterns in the process of manufacturing the multilayer wiring board. Specifically, the release strength of the first release layer 14 may be a first proof stress generated when the first support 12 is released from the build-up wiring layer, while the release strength of the second release layer 28 may be a second proof stress generated when the second support 30 is released from the multilayer laminate 26, and these proof stresses can be compared.

The release strength of the second release layer 28 has preferably 1.02 to 300 times, more preferably 1.05 to 100 times, further more preferably 3.0 to 50 times, and particularly more preferably 5.0 to 30 times the release strength of the first release layer 14. For example, the second release layer 28 has a release strength of preferably 30 to 300 gf/cm, more preferably 40 to 250 gf/cm, further more preferably 50 to 175 gf/cm, particularly more preferably 70 to 150 gf/cm. Within such ranges, a stress concentration on the multilayer wiring layer can be more effectively prevented when the first support 12 is released at the first release layer 14, and thereby the disconnection in the multilayer wiring layer can be avoided more effectively. In addition, the unusual release (accompanying release) of the second release layer 28 can be prevented more effectively when the first support 12 is released at the first release layer 14; hence, the surface of the first wiring layer 18f after the first support 12 is released at the first release layer 14 can be kept flat more definitely. The release strength of the second release layer 28 can be measured basically in the same manner as the above method of measuring the release strength of the first release layer 14, but It should be noted that this strength refers to the release strength before the treatment, such as irradiation of ultraviolet light, heating, and dissolution, to reduce the release strength. Specifically, the release strength of the second release layer 28 is measured as follows. The second release layer 28 is formed on the second support 30, and a copper foil having a thickness of 18 μm is stacked on the second release layer to form a copper-clad laminate. A release strength (gf/cm) is then measured in accordance with JIS C 6481-1996 at the time when the copper foil is released.

(4) Bonding of Third Support (Optional Step)

Figure 4:
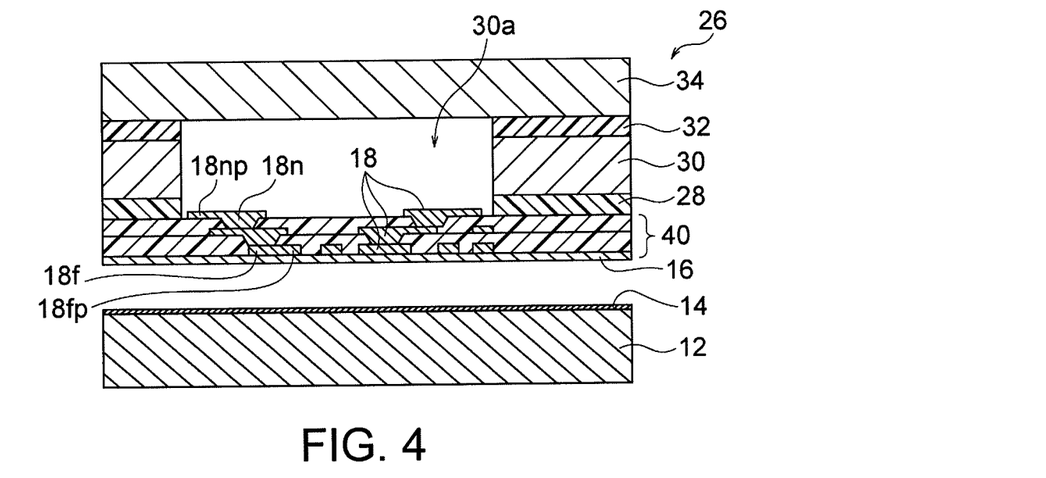
FIG. 4 is a schematic cross-sectional view illustrating an embodiment of a multilayer laminate further reinforced with a third support.

As shown in FIG. 4, before the release of the first support 12, a third support 34 having no opening may be optionally bonded on the second support 30 of the reinforced multilayer laminate 26 with the third release layer 32 therebetween. This configuration can minimize the deformation of the multilayer laminate 26 when the first support 12 is released in the next step. In this case, the third release layer 32 may be applied to the entire area of the surface to be bonded of the third support 34, or may be applied only to the partial area of the surface to be bonded of the third support 34.

The material of the third support 34 may be the same as that of the second support 30. Accordingly, the preferred embodiment with respect to the second support 30 also applies to the third support 34. The material of the third release layer 32 may also be the same as that of the second release layer 28, and the above material with respect to the second release layer 28 also applies to the third release layer 32. However, the third release layer 32 preferably contains no soluble adhesive agent. The third release layer 32 is preferably a material based on mechanical separation. The release strength of the third release layer 32 is preferably higher than that of the first release layer 14 and lower than that of the second release layer 28. The thickness of the third support 34 is preferably smaller than that of the second support 30 in view of readiness of releasing the third support 34. A method of comparing the release strength in the third support 34 with that in the first release layer 14 or that in the second release layer 28 may be advantageously based on the comparison between the measured values in accordance with the respective releasing patterns in the process of manufacturing the multilayer wiring board. Specifically, the release strength of the first release layer 14 may be a first proof stress generated when the first support 12 is released from the build-up wiring layer, the release strength of the second release layer 28 may be a second proof stress generated when the second support 30 is released from the multilayer laminate 26, and the release strength of the third release layer 32 may be a third proof stress generated when the second support 30 is released from the second support 30. Accordingly, the method may be also based on the comparison among the first proof stress, the second proof stress and the third proof stress.

(5) Release of First Support

As shown in FIG. 2(d), the first support 12 is released from the reinforced multilayer laminate 26 at the position of the first release layer 14. In this manner, the first support 12 and the first release layer 14 are released and removed, preferably based on physical separation process. In this physical separation process, the first support 12, for example, is released from the build-up wiring layer with hand, a jig, or machines. In this case, the second support 30 closely bonds to and reinforces with the multilayer laminate 26 with the second release layer 28 therebetween; hence, the great local warpage can be prevented on the multilayer laminate 26. In other words, the second support 30 reinforces the multilayer laminate 26 to resist the releasing force during the release of the first support 12, thereby preventing and reducing the warpage more effectively. In this manner, the disconnection and separation of the wiring layer which may be caused by the warpage can be avoided inside the build-up wiring layer, thereby connection reliability of the multilayer wiring layer can be improved. In addition, the flatness (coplanarity) on the two surfaces of the multilayer wiring layer can be improved through the effective prevention or reduction of warpage. As a result, the probing can be accurately performed at the time of the electrical inspection.

When the first support 12 is released, the separation at the second release layer 28 is more effectively avoided if the second release layer 28 has a higher release strength than the first release layer 14, and the separation at the first release layer 14 can be further facilitated. The second support 30 closely bonded to the multilayer laminate 26 with the second release layer 28 therebetween can more stably hold the close bonded state even when the first support 12 is released.

In the embodiment of the above (i), when the wiring layer 18 is initially formed as the first wiring layer 18f on the surface, remote from the first release layer 14, of the metal layer 16, the metal layer 16 may be preferably removed after the release of the first support 12 and before the electrical inspection as shown in FIG. 2(e). In this step, the first wiring layer 18f can be exposed. The metal layer 16 may be removed by a known etching technique such as flash etching.

In the embodiment of the above (ii), when the first wiring layer 18f is formed after the release of the first support 12, the metal layer 16 may be etched after the release of the first support 12 and before the electric inspection, and then the first wiring layer 18f including the first connection pads 18fp may be formed by etching as described above. Alternatively, the first wiring layer 18f including the first connection pads 18fp may be formed on the surface, remote from the insulating layer 20, of the metal layer 16 after the release of the first support 12 and before the electrical inspection.

After the above steps, a solder resist layer, a surface metal treatment layer (for example, an organic solderability preservative (OSP) treatment layer, an Au plating layer, a Ni—Pd—Au plating layer, and a Ni—Au plating layer), a metal pillar for mounting electronic devices, and/or a solder bump may be formed on the surface of the first wiring layers 18f as needed.

(6) Attachment of Plate Having Opening (Optional Step)

Figure 5:
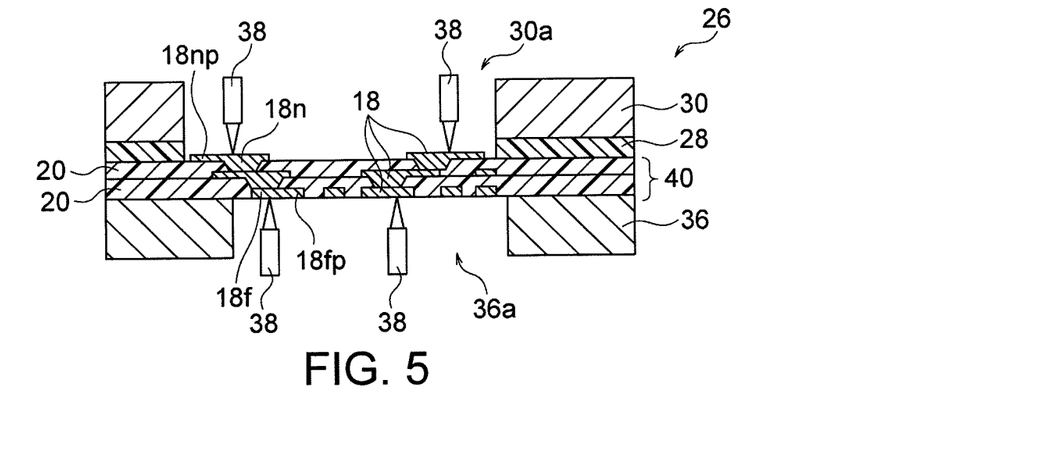
FIG. 5 is a schematic cross-sectional view illustrating an embodiment involving probing performed from the two sides of a multilayer laminate with a plate.

As shown in FIG. 5, a plate 36 is optionally attached to the surface, adjacent to the first wiring layers 18f, of the reinforced multilayer laminate 26, after the release of the first support 12 and before the electric inspection. The plate 36 has an opening 36a and is attached to the multilayer laminate 26 such that at least a part of the first connection pads 18fp is disposed within the opening 36a. Through the attachment of the plate 36, the flatness of the multilayer laminate 26 can be stably maintained even after the release of the first support 12, and more reliable probing can be performed in the electrical inspection. In addition, the conductors 38 can be put into contact with the first connection pads 18fp through the opening 36a of the plate 36. The plate 36 may be composed of any material, such as aluminum, stainless steel, nickel, copper, titanium and alloys thereof, glass, ceramic, epoxy resin, polycarbonate resin, Teflon™ resin and laminate thereof. The plate 36 may be attached to the multilayer laminate 26 with an adhesive therebetween, or the multilayer laminate 26 may be disposed without the adhesive on the plate 36. Alternatively, the plate 36 may be attached to the multilayer laminate 26 through vacuum suction.

(7) Release of Third Support (Optional Step)

When the third support 34 is used as shown in FIG. 4, the third support 34 is released at the third release layer 32 from the reinforced multilayer laminate 26 after the release of the first support 12 and before the electrical inspection. Physical separation or chemical separation, for example, can be employed in this releasing step. In the physical separation, the third support 34, for example, is released from the build-up wiring layer with hand, a jig, or machines to give the multilayer wiring board 40. The third release layer 32 is harder to be released than the first release layer 14 when the third release layer 32 has a higher release strength than the first release layer 14. However, when the third release layer 32 is the resin containing the foaming agent as described above, the foaming agent in the third release layer 32 is foamed through heat treatment or ultraviolet light treatment before the release, thereby the third release layer 32 turns to a brittle state and the physical separation can be readily achieved.

(8) Detachment of Plate (Optional Step)

When the plate 36 is attached to the reinforced multilayer laminate 26, the plate 36 is detached after the electrical inspection. The plate 36 may be detached based on a known technique.

(9) Electrical Inspection

As shown in FIG. 2(f), the conductors 38 are put into contact with the n-th connection pads 18np of the reinforced multilayer laminate 26 to perform the electrical inspection. The conductors 38 may be put into contact with the first connection pads 18fp as needed. Typical examples of the conductors 38 include contact probes (contact terminals). This electrical inspection may be performed after the release of the first support 12, or before the release of the first support 12 if the second support 30 has been already bonded. In any case, according to the method of the present invention, through bonding the second support 30 having the opening 30a to the multilayer laminate 26 preliminarily including the first support 12, the opening 30a of the second support 30 can be positioned with high accuracy relative to the n-th connection pads 18np on the surface of the multilayer laminate 26, and the reduction in warpage can secure the desired flatness on the two surfaces of the multilayer laminate 26, thereby the accurate probing can be performed for the electrical inspection. As described later, a continuity test and an insulation test may be simultaneously performed for the electrical inspection.

The electrical inspection before the release of the first support 12 is preferably performed by serving the metal layer 16 as a common electrode. For example, the conductors 38 is put into contact with one of the n-th connection pads 18np, and a plurality of first connection pads 18fp are electrically short-circuited through the metal layer 16 as the common electrode. In this manner, the conduction can be inspected between the n-th connection pads 18np in contact with the conductors 38 and the first connection pads 18fp. In this embodiment, the second electrical inspection is carried out after the etching of the metal layer 16 in order to determine the insulation level.

The electrical inspection after the release of the first support 12 is preferably performed after etching the metal layer 16 exposed after the release of the first support 12. In this case, the preferred inspection method includes three patterns as follows.

Pattern (a): A Conductive Sheet is Put into Close Contact with the Surface from which the First Connection Pads 18Fp are Exposed The conductive sheet is put into close contact with the multilayer wiring board 40 so as to come into contact with a plurality of first connection pads 18fp. In this manner, the conductive sheet serves as a common electrode while the conductors 38 comes into contact with the n-th connection pads 18np. A continuity test can be thereby performed. Examples of the conductive sheet include a conductive rubber sheet and a metal sheet. An insulation test can be also performed after removing the conductive sheet.

Pattern (b): A Conductive Sheet is Put into Close Contact with the Surface from which the n-th Connection Pads 18Np are Exposed The conductive sheet is put into close contact with the multilayer wiring board 40 so as to come into contact with a plurality of the n-th connection pads 18np. In this manner, the conductive sheet serves as a common electrode while the conductors 38 comes into contact with the first connection pads 18fp. A continuity test can be thereby performed. Examples of the conductive sheet include a conductive rubber sheet and a metal sheet. An insulation test can be also performed after removing the conductive sheet.

Pattern (c): The Conductors 38 are Put into Contact with the Two Surfaces of the Multilayer Wiring Board 40

As shown in FIG. 2(f), the conductors 38 are put into contact with the two surfaces of the multilayer wiring board 40 without the common electrode and then both the continuity test and the insulation test can be simultaneously performed. For example, a pair of conductors 38 is put into contact with one of the first connection pads 18*fp* and the conducted n-th connection pad 18*np*, to perform the continuity test, while a pair of conductors 38 is put into contact with one of the first connection pads 18*fp* and the insulated n-th connection pad 18*np* to perform the insulation test.

(10) Release of Second Support

After the electrical inspection, the second support 30 is released from the reinforced multilayer laminate 26 at the position of the second release layer 28 to give the multilayer wiring board 40. In this releasing step, physical separation and chemical separation, for example, can be employed. In the physical separation, the second support 30, for example, is released from the build-up wiring layer with hand, a jig or machine to give the multilayer wiring board 40. When the second release layer 28 has a higher release strength than the first release layer 14, the second release layer is harder to be released than the first release layer 14. As described above, in the case that the second release layer 28 is a resin layer containing a foaming agent, the second release layer 28 can be modified to a brittle state and is physically separated by foaming the foaming agent in the second release layer 28 through heat treatment or ultraviolet light treatment. In the case that the second release layer 28 is an acid-soluble resin layer or an alkali-soluble resin layer, the physical separation can be facilitated by dissolving the second release layer 28 with a chemical (for example, an acid solution or an alkaline solution). In the chemical separation, the multilayer wiring board 40 can be given using an etching solution that dissolves both the second support 30 and the second release layer 28.

(11) Others

At least one side of the first support 12, the second support 30 and/or the third support 34 preferably extends from the end portion of the build-up wiring layer. When the first support 12, the second support 30, or the third support 34 is released, such an extension has advantages that can grasp the end portion and readily release these supports.

Laminated Sheet

As described above, the laminated sheet 10 used in the method of the present invention comprises, in sequence, the first support 12, the first release layer 14, and the metal layer 16. The laminated sheet 10 may be in the form of a so-called copper foil with a carrier.

The first support 12 may be made of any material, such as glass, ceramic, resin, or metal. The first support 12 may have any form, such as a sheet, a film, a plate, or a foil. Further, the first support 12 may be a laminate of these sheets, films, plates and/or foils. For example, the first support 12 may be a rigid support, such as a glass plate, a ceramic plate or a metal plate, or may be a non-rigid support, such as a metal foil or a resin film. Preferred examples of the first support 12 include metal sheets, glass sheets, ceramic plates, laminates of metal sheets and prepregs, metal sheets coated with adhesives, and resin sheets (in particular hard resin sheets). Preferred examples of the metal of the first support 12 include copper, titanium, nickel, stainless steel, and aluminum. Preferred examples of the ceramics include alumina, zirconia, silicon nitride, and aluminum nitride (fine ceramics). Preferred examples of the resin include epoxy resins, aramid resins, polyimide resins, polyamide or nylon resins, liquid crystal polymers, PEEK resins, polyamideimide resins, polyethersulfone resins, polyphenylene sulfide resins, PTFE resins, and ETFE resins. More preferably the thermal expansion coefficient (CTE) is less than 25 ppm/K (preferably 1.0 to 23 ppm/K, more preferably 1.0 to 15 ppm/K, further more preferably 1.0 to 10 ppm/K), from the viewpoint of preventing warpage of a coreless support due to heat when an electronic device is mounted. Examples of such materials include various resins as described above (especially resins with low thermal expansion, such as polyimide resins or liquid crystal polymers), prepregs made of various resins and glass fibers as described above, glass, and ceramics. In view of handling properties and securing the flatness when a chip is mounted, the first support 12 has a Vickers hardness of preferably 500 to 3000 HV, more preferably 550 to 2500 HV, further more preferably 600 to 2000 HV.

For materials that satisfies these properties, the first support 12 is preferably composed of a resin film, glass or ceramic, more preferably glass or ceramic, particularly more preferably glass. For example, the first support 12 is a glass sheet. The first support 12 composed of glass has light weight, low thermal expansion coefficient, high insulating properties, high rigidity and high surface flatness, and thus the metal layer 16 has a significantly smooth surface. In addition, the first support 12 composed of glass has some advantages, for example, surface flatness (coplanarity) favorable to mounting of the electronic device, and chemical resistance during the desmear step and various plating steps in a manufacturing process of the printed wiring board. Preferred examples of the glass constituting the first support 12 include quartz glass, borosilicate glass, alkali-free glass, soda-lime glass, aluminosilicate glass, and combinations thereof, more preferably alkali-free glass. The alkali-free glass, which contains substantially no alkali metal, contains silicon dioxide, aluminum oxide, boron oxide, an alkaline earth metal oxide, such as calcium oxide or barium oxide as main components, and further contains boric acid. Since the alkali-free glass has a low thermal expansion coefficient in the range of 3 to 5 ppm/K over a wide temperature range from 0° C. to 350° C., the warpage of the glass can be advantageously minimized when a semiconductor chip is mounted as an electronic device.

The first support 12 has a thickness of preferably from 100 to 2000 μm, more preferably from 300 to 1800 μm, further more preferably from 400 to 1100 μm. At a thickness within such ranges, the printed wiring board can be thinned while retaining adequate strength that does not interfere handling and electronic parts can be mounted with reduced warpage.

The surface, adjacent to the first release layer 14 (adjacent to an adhesive metal layer if present), of the first support 12 has an arithmetic mean roughness Ra of preferably 0.1 to 70 nm, more preferably 0.5 to 60 nm, further more preferably 1.0 to 50 nm, particularly more preferably 1.5 to 40 nm, most preferably 2.0 to 30 nm as measured in accordance with JIS B 0601-2001. A smaller arithmetic mean roughness on the surface, adjacent to the first release layer 14, of the first support 12 desirably causes a smaller arithmetic mean roughness Ra on the surface, remote from the first release layer 14 (the outer surface of the metal layer 16), of the metal layer 16. As a result, the roughness Ra is suitable for forming a wiring pattern highly refined to a line/space (US) ratio of 13 μm or less/13 μm or less (for example, from 12 μm/12 μm to 1 μm/1 μm) in a printed wiring board manufactured with the laminated sheet 10.

The laminated sheet 10 may have an optional adhesive metal layer and/or an optional auxiliary release layer, preferably in this order, on the surface, adjacent to the first release layer 14, of the first support 12.

The optional adhesive metal layer is preferably composed of at least one metal selected from the group consisting of Ti, Cr and Ni, and may be a pure metal or an alloy from the viewpoint of assuring the adhesion to the first support 12. The metal composed of the adhesive metal layer may contain incidental impurities derived from, for example, raw material components and a formation process of film. Also, the metal may contain oxygen derived from the air when the adhesive metal layer is exposed to the atmosphere after the formation of film. The adhesive metal layer is preferably formed by a gas-phase process such as sputtering. In particular, the adhesive metal layer is preferably formed by a magnetron sputtering process with a metal target because the process can improve the uniformity of distribution in film thickness. The adhesive metal layer has a thickness of preferably 5 to 500 nm, more preferably 10 to 300 nm, further more preferably 18 to 200 nm, particularly more preferably 20 to 150 nm. The thickness is measured by analyzing the cross-sectional area of the layer with an energy dispersive X-ray spectrometer in a transmission electron microscope (TEM-EDX).

An optional auxiliary release layer is preferably composed of copper in view of controlling release strength of the first release layer 14 into a desired value. The copper that constitutes the auxiliary release layer may contain incidental impurities derived from, for example, raw material components or a formation process of film. Also, the metal may contain oxygen derived from the air when the auxiliary release layer is exposed to the atmosphere before and after the formation of film. However, the adhesive metal layer and the auxiliary release layer may be preferably continuously formed without exposing to the atmosphere. The auxiliary release layer is preferably formed by a gas-phase process such as sputtering. In particular, the auxiliary release layer is preferably formed by a magnetron sputtering process with a copper target because the process can improve the uniformity of distribution in film thickness. The auxiliary release layer has a thickness of preferably 5 to 500 nm, more preferably 10 to 400 nm, further more preferably 15 to 300 nm, particularly more preferably 20 to 200 nm. The thickness is measured by analyzing the cross-sectional area of the layer with an energy dispersive X-ray spectrometer in a transmission electron microscope (TEM-EDX).

The first release layer 14 may be composed of any material that is releasable from the first support 12. For example, the first release layer 14 can be composed of a known material employed as a release layer of a copper foil with a carrier. The first release layer 14 may be either an organic release layer or an inorganic release layer. Examples of organic components used in the organic release layer include nitrogen-containing organic compounds, sulfur-containing organic compounds, and carboxylic acids. Examples of the nitrogen-containing organic compounds include triazole corn pounds and imidazole compounds. Examples of the inorganic components used in the inorganic release layer include at least one metal oxide selected from the group consisting of Ni, Mo, Co, Cr, Fe, Ti, W, P and Zn, mixture of metals and nonmetals, and carbon. It is preferred that the first release layer 14 is a layer mainly containing carbon, more preferably a layer mainly composed of carbon or hydrocarbon, and further more preferably a film of amorphous carbon as hard carbon, or a carbon-nitrogen mixture from the viewpoint of ready separation and formation of film. In this case, the first release layer 14 (i.e. the carbon layer) has preferably a carbon content of 60 atomic % or more, more preferably 70 atomic % or more, further more preferably 80 atomic % or more, particularly more preferably 85 atomic % or more, measured by XPS. The carbon content has no upper limit and may be 100 atomic % or practically 98 atomic % or less. The first release layer 14 (particularly, the carbon layer) may contain incidental impurities (for example, oxygen, carbon and hydrogen derived from an atmospheric environment). In addition, metal atoms may be mixed into the first release layer 14 (in particular, the carbon layer) depending on a process of forming the metal layer 16. Since carbon has low diffusion to and low reactivity with the first support 12, the formation of the metallic bond between the metal layer 16 (e.g., copper foil layer) and the bonding interface can be prevented at an elevated temperature, and the first support 12 can be maintained under a condition where release and removal are ready even when a press working is carried out at a temperature exceeding 300° C. The first release layer 14 is preferably formed by a gas-phase process such as sputtering, in order to avoid excess impurities in the amorphous carbon and to achieve continuous formation of the adhesive metal layer and/or auxiliary release layer. The first release layer 14 has a thickness of preferably 1 to 20 nm, more preferably 1 to 10 nm. The thickness is measured by analyzing the cross-sectional area of the layer with an energy dispersive X-ray spectrometer in a transmission electron microscope (TEM-EDX).

The first release layer 14 preferably has a release strength of 1 to 30 gf/cm, more preferably 3 to 20 gf/cm, further more preferably 4 to 15 gf/cm in order to minimize the stress concentration to the first wiring layer 18*f* to the utmost and thereby facilitate the release process when the first release layer 14 is separated. The release strength of the first release layer 14 is measured as follows: A first release layer 14 is formed on a first support 12, a copper layer as a metal layer 16 is formed on the first release layer to give a laminated sheet, an electroplated copper film having a thickness of 18 μm is formed on the laminated sheet, and a copper-clad laminate is thereby formed; and then, the release strength (gf/cm) is measured in accordance with JIS C 6481-1996 when the electroplated copper film integrated with the metal layer 16 is separated.

The release strength of the first release layer 14 can be adjusted by, for example, controlling the thickness of the first release layer 14, or selecting the composition of the first release layer 14.

The metal layer 16 is composed of metal, and preferably includes a power supply sublayer to supply power to the first wiring layer 18*f* described below. The metal layer 16 or the power supply sublayer may be a copper foil produced by any process, for example, a wet process, such as an electroless copper plating or an electrolytic copper plating; a physical vapor deposition process, such as sputtering or vacuum vapor deposition; chemical vapor deposition; or a combination thereof. The preferred metal that constitutes the power supply sublayer is copper and thus the preferred power supply sublayer can be an extremely thin copper layer. The power supply sublayer is composed of particularly preferably a copper layer deposited by a gas-phase process, such as sputtering or vacuum vapor deposition, and most preferably a copper layer deposited by the sputtering in order to appropriately build a fine pitch circuit through an extremely thinning process. Although the extremely thin copper layer is preferably a non-roughened copper layer, it may be subjected to preliminary roughening or secondary roughening, such as soft etching, cleaning, or oxidation-reduction, as long as the roughening process does not interfere with the formation of a wiring pattern when a printed wiring board is manufactured. The power supply sublayer (for example, an extremely thin copper layer) constituting the metal layer 16 may have any thickness of, preferably 50 to 3000 nm, more preferably 70 to 2500 nm, further more preferably 80 to 2000 nm, particularly preferably 90 to 1500 nm, particularly more preferably 120 to 1000 nm, most preferably 150 to 500 nm in order to form a fine pitch circuit as described above. The power supply sublayer having a thickness within the above range (for example, an extremely thin copper layer) is preferably manufactured by a sputtering process from the viewpoint of the in-plane uniformity of the layer thickness and the productivity to yield a layer in the form of a sheet or a roll.

The surface, remote from the first release layer 14 (the outer surface of the metal layer 16), of the metal layer 16 has an arithmetic mean roughness Ra of preferably 1.0 to 100 nm, more preferably 2.0 to 40 nm, further more preferably 3.0 to 35 nm, particularly more preferably 4.0 to 30 nm, most preferably from 5.0 to 15 nm as measured in accordance with JIS B 0601-2001. A smaller arithmetic mean roughness is suitable for forming a wiring pattern more highly refined to a line/space (US) ratio of 13 µm or less/13 µm or less (for example, from 12 µm/12 µm to 1 µm/1 µm) in a printed wiring board manufactured with the laminated sheet 10. In the case of such a smooth surface, a contactless surface roughness measurement is preferably employed in the measurement of the arithmetic mean roughness Ra.

The metal layer 16 may have a multilayer structure composed of two or more sublayers. For example, the metal layer 16 may have an antireflection sublayer on the surface, adjacent to the first release layer 14, of the power supply sublayer in addition to the power supply sublayer. In other words, the metal layer 16 may include the power supply sublayer and the antireflection sublayer. The antireflection sublayer is preferably composed of at least one metal selected from the group consisting of Cr, W, Ta, Ti, Ni and Mo. At least the surface, adjacent to the power supply sublayer, of the antireflection sublayer is preferably composed of aggregates of metal particles. The antireflection sublayer may have a structure which is entirely composed of the aggregates of metal particles, or a multilayer structure including a subsublayer composed of the aggregates of metal particles and a subsublayer that is not composed of particles below the subsublayer composed of the particles. The aggregates of metal particles constituting the surface, adjacent to the power supply sublayer, of the antireflection sublayer exhibits a desirable dark color caused by a metal material and a particulate form, and the dark color results in a desirable visual contrast to the wiring layer composed of copper and thereby improves the visibility in image inspection (for example, automatic optical inspection (AOI)). Accordingly, the surface of the antireflection sublayer irregularly reflects light due to a convex shape of the metal particles to be recognized as the black color. In addition, the antireflection sublayer has appropriate adhesion and separability to the first release layer 14, excellent adhesion to the power supply sublayer, and excellent separation resistance to the developer when a photoresist layer is formed. The surface, adjacent to the power supply sublayer, of the antireflection sublayer preferably has a glossiness Gs (at 60°) of 500 or less, more preferably 450 or less, further more preferably 400 or less, particularly more preferably 350 or less, most preferably 300 or less in view of improvements in contrast and visibility. Since a lower limit of the glossiness Gs (at 60°) is preferably as low as possible, the glossiness Gs (at 60°) on the surface, adjacent to the power supply sublayer, of the antireflection sublayer may be any low value of, practically 100 or more, and more practically 150 or more. Specular glossiness Gs (at 60°) by image analysis of roughened particles can be measured with a commercially available glossiness meter in accordance with JIS Z 8741-1997 (method of measuring specular glossiness).

In order to improve the contrast and the visibility and to enhance the uniformity of flash etching, the surface, adjacent to the power supply sublayer, of the antireflection sublayer is composed of aggregates of metal particles. In such particles, the equivalent circle diameter of a projected area determined by SEM image analysis is preferably 10 to 100 nm, more preferably 25 to 100 nm, further more preferably 65 to 95 nm. The equivalent circle diameter of the projected area can be measured by photographing the surface of the antireflection sublayer at a predetermined magnification (for example, 50,000 folds) with a scanning electron microscope and analyzing the resultant SEM images. In particular, the arithmetic mean value of the equivalent circle diameters of the projected area is employed in this measurement where the equivalent circle diameters are measured with commercially available software for image analytical particle size distribution (for example, Mac-VIEW manufactured by Mountech Co., Ltd.).

The antireflection sublayer is composed of at least one metal selected from Cr, W, Ta, Ti, Ni and Mo, preferably at least one metal selected from Ta, Ti, Ni and Mo, more preferably at least one metal selected from Ti, Ni and Mo, most preferably Ti. These metals may be pure metals or alloys. Since this sublayer has a predetermined sheet resistance, the continuity test can be readily performed through, for example, via holes. In any case, these metals are preferably not inherently oxidized (essentially not metal oxides) to exhibit a desired dark color which can improve a visual contrast to Cu. In particular, the antireflection sublayer has an oxygen content of preferably 0 to 15 atomic %, more preferably 0 to 13 atomic %, further more preferably 1 to 10 atomic %. In any case, the metals do not dissolve in a copper flash etching solution, and thereby can exhibit excellent chemical resistance to the copper flash etching solution. The antireflection sublayer has a thickness of preferably 1 to 500 nm, more preferably 10 to 300 nm, further more preferably 20 to 200 nm, most preferably 30 to 150 nm.

The invention claimed is:

1. A method of manufacturing a multilayer wiring board comprising:
    providing a laminated sheet comprising, in sequence, a first support, a first release layer, and a metal layer;
    alternately stacking wiring layers and insulating layers on a surface of the metal layer to give a multilayer laminate, wherein an n-th wiring layer being the uppermost layer includes an n-th connection pad;
    bonding a second support having an opening on a surface, remote from the laminated sheet, of the multilayer laminate with a second release layer therebetween, such that at least a part of the n-th connection pad is disposed within the opening to give a reinforced multilayer laminate, wherein the second release layer is applied to the entire area or the partial area of the surface to be bonded of the second support;
    releasing the first support from the reinforced multilayer laminate at the position of the first release layer; and
    putting conductors into contact with the n-th connection pads of the reinforced multilayer laminate to perform electrical inspection;
    wherein a release strength of the second release layer is higher than the release strength of the first release layer.

2. The method according to claim 1, wherein the second support has a spring deflection limit $Kb_{0.1}$ of 100 to 1500 $N/mm^2$ as measured in accordance with JIS H 3130-2012.

3. The method according to claim 1, wherein the wiring layer initially formed on the surface, remote from the first release layer, of the metal layer is a first wiring layer including a first connection pad.

4. The method according to claim 1, further comprising forming a first wiring layer including a first connection pad by etching the metal layer after releasing the first support and before the electrical inspection.

5. The method according to claim 1, further comprising forming a first wiring layer including a first connection pad on a surface, remote from the insulating layer, of the metal layer after releasing the first support and before the electrical inspection.

6. The method according to claim 3, further comprising:
attaching a plate having an opening onto the surface, adjacent to the first wiring layer, of the reinforced multilayer laminate after releasing the first support and before the electrical inspection such that at least a part of the first connection pad is disposed within the opening, and
detaching the plate after the electrical inspection.

7. The method according to claim 3, wherein the step of electrical inspection includes putting conductors into contact with the first connection pads in addition to the n-th connection pads.

8. The method according to claim 1, further comprising:
bonding a third support having no opening to the second support of the reinforced multilayer laminate with a third release layer therebetween before releasing the first support, wherein the third release layer is applied to the entire area or the partial area of the surface to be bonded of the third support; and
releasing the third support from the reinforced multilayer laminate at the position of the third release layer after releasing the first support and before the electrical inspection.

9. The method according to claim 1, further comprising releasing the second support from the reinforced multilayer laminate at the position of the second release layer after the electrical inspection to give the multilayer wiring board.

* * * * *